US008151578B1

(12) United States Patent
Morales et al.

(10) Patent No.: US 8,151,578 B1
(45) Date of Patent: Apr. 10, 2012

(54) MULTI-MODE COOLING SYSTEM WITH PRE-DEHUMIDIFICATION

(75) Inventors: Osvaldo P. Morales, Seattle, WA (US); Jonathan David Hay, Kirkland, WA (US)

(73) Assignee: Amazon Technologies, Inc., Reno, NV (US)

( * ) Notice: Subject to any disclaimer, the term of this patent is extended or adjusted under 35 U.S.C. 154(b) by 463 days.

(21) Appl. No.: 12/491,941

(22) Filed: Jun. 25, 2009

(51) Int. Cl.
F25D 17/06 (2006.01)

(52) U.S. Cl. ............................. 62/91; 62/259.2; 62/259.4

(58) Field of Classification Search ................ 62/91, 92, 62/119, 176.4, 187, 259.2, 259.4, 129; 165/104.33, 165/222; 361/28, 153; 454/110, 184
See application file for complete search history.

(56) References Cited

U.S. PATENT DOCUMENTS

| | | | |
|---|---|---|---|
| 4,118,945 A * | 10/1978 | Boochever et al. | 62/176.4 |
| 6,076,739 A * | 6/2000 | Littleford et al. | 236/44 R |
| 6,141,986 A | 11/2000 | Koplin | |
| 7,010,392 B2 | 3/2006 | Bash et al. | |
| 7,197,433 B2 * | 3/2007 | Patel et al. | 702/188 |
| 7,278,273 B1 | 10/2007 | Whitted et al. | |
| 2004/0000152 A1 * | 1/2004 | Fischer | 62/94 |
| 2005/0016197 A1 * | 1/2005 | Bourne et al. | 62/310 |
| 2005/0228618 A1 * | 10/2005 | Patel et al. | 702/188 |
| 2007/0028769 A1 * | 2/2007 | Eplee et al. | 95/113 |
| 2007/0101746 A1 | 5/2007 | Scholm et al. | |
| 2008/0029250 A1 | 2/2008 | Carlson et al. | |
| 2008/0055846 A1 | 3/2008 | Clidaras et al. | |
| 2008/0094797 A1 | 4/2008 | Coglitore et al. | |
| 2008/0259566 A1 | 10/2008 | Fried | |

OTHER PUBLICATIONS

U.S. Appl. No. 11/535,180.
U.S. Appl. No. 12/341,137, filed Dec. 28, 2008.
U.S. Appl. No. 11/956,849, filed Dec. 14, 2007.
U.S. Appl. No. 12/163,146, filed Jun. 27, 2008.

* cited by examiner

Primary Examiner — Mohammad Ali
(74) Attorney, Agent, or Firm — Robert C. Kowert; Meyertons, Hood, Kivlin, Kowert & Goetzel, P.C.

(57) ABSTRACT

A system for cooling computer systems in a room of a data center includes a dehumidification system and an air channeling sub-system. The air channeling sub-system includes a mechanical cooling section that removes heat from the cooling air and an evaporative cooling section downstream from the mechanical cooling section. The dehumidification system may be upstream from the mechanical cooling section and the evaporative cooling section. A controller for the cooling system selectively operates the mechanical cooling section and the evaporative cooling section in an adiabatic mode if a first set of control conditions is met and in a hybrid mode if a second set of control conditions is met.

25 Claims, 12 Drawing Sheets

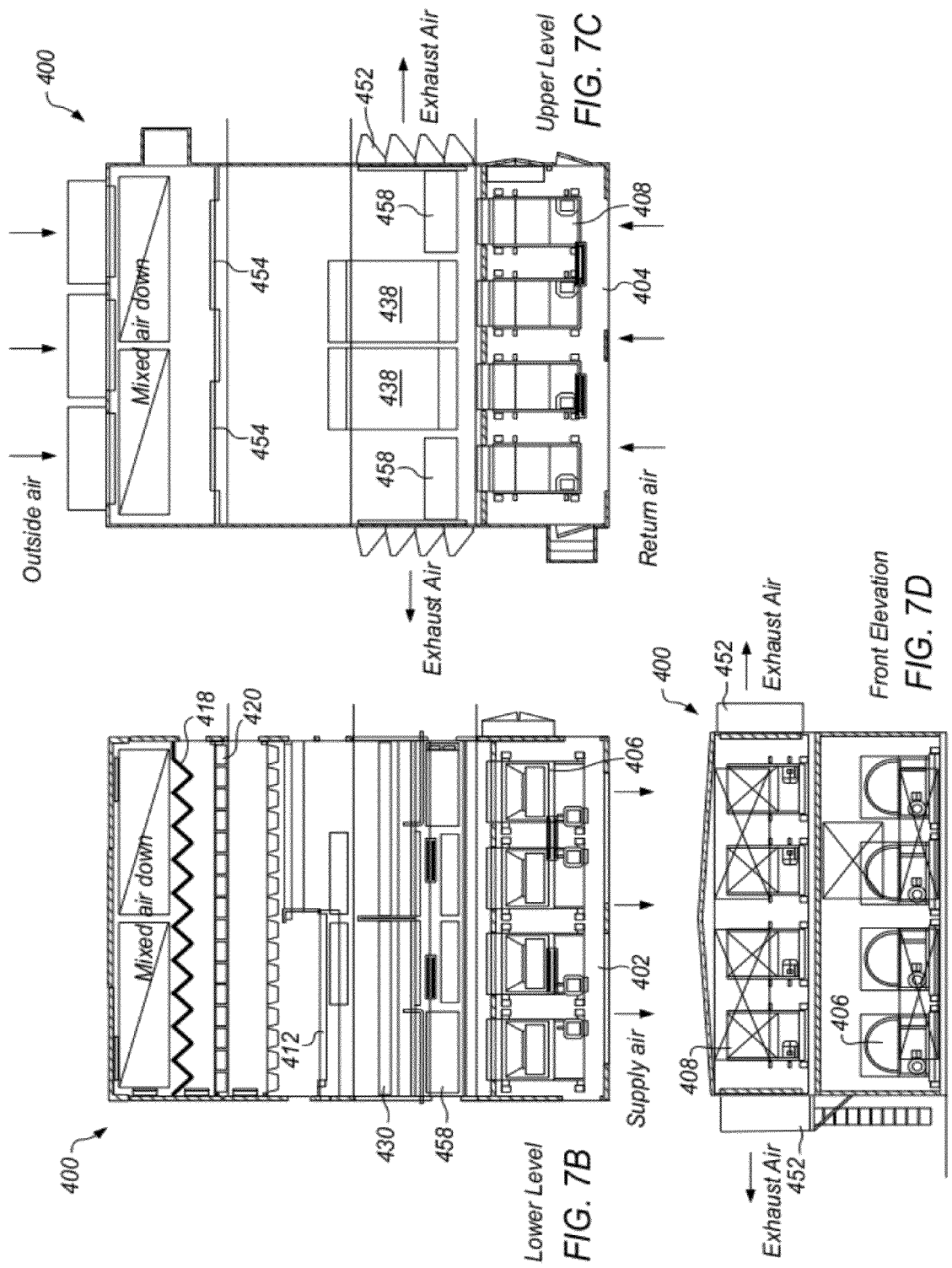

MULTI-MODE COOLING SYSTEM WITH PRE-DEHUMIDIFICATION

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

Some data centers use outside air as an important source of cooling air. The characteristics and quality of outside air may vary widely, however, even at a given location. Aside from the significant changes in temperature and humidity that can occur with the change of seasons, environmental quality of the outside air may vary due to a myriad of external factors. For example, smoke, smog, and airborne by-products of industrial and/or agricultural activities can all affect usability of outside air for cooling purposes. These variations over time in availability, cooling capacity, and quality of outside air create challenges in effectively sizing and operating cooling air systems for a data center. For example, a mechanical cooling system that is sized for cooler, drier times of year may fail to provide adequate cooling in hot, humid weather. Conversely, a mechanical cooling system that is sized to provide effective cooling during hot, humid summer months may result in a system that is significantly oversized for cooler, drier times of year.

BRIEF DESCRIPTION OF THE DRAWINGS

FIG. 7B is a plan view of the lower level of the air handling system shown in FIG. 7A.

FIG. 7C is a plan view of the upper level of the air handling system shown in FIG. 7A.

FIG. 7D is a front elevation view of the air handling system shown in FIG. 7A.

Figure 1:
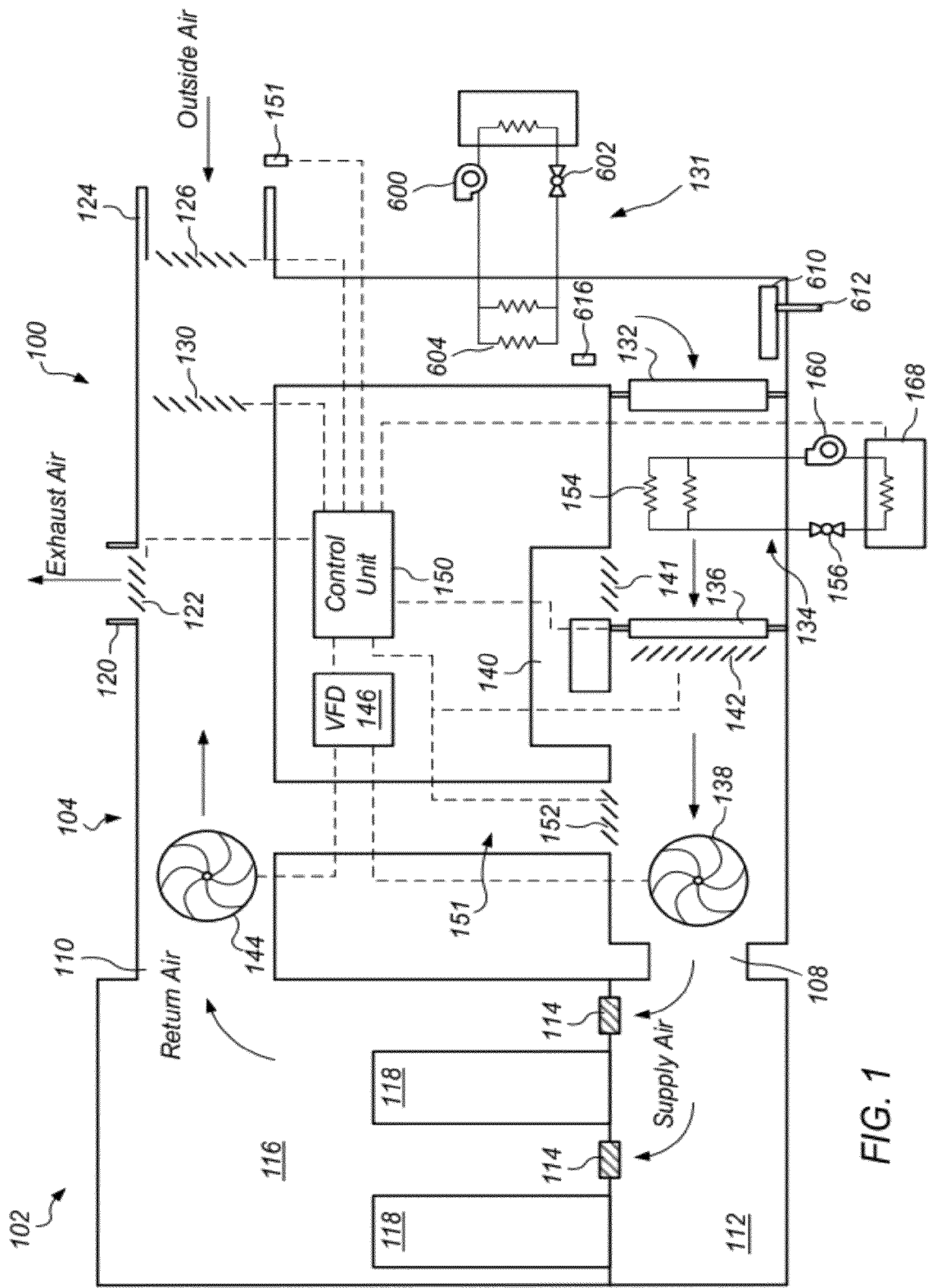
FIG. 1 is a schematic diagram illustrating one embodiment of a data center cooling system including a mechanical system and an adiabatic system, and further including a dehumidification system inside an air handling system at a location upstream from the mechanical system.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for cooling electronic equipment in a data center are disclosed. According to one embodiment, a system for cooling computer systems in a room of a data center includes a dehumidification system and an air channeling sub-system. The air channeling sub-system includes a mechanical cooling section that removes heat from the cooling air and an evaporative cooling section downstream from the mechanical cooling section. In some embodiments, the dehumidification system is upstream from the mechanical cooling section and the evaporative cooling section. In certain embodiments, a controller for the cooling system selectively operates the mechanical cooling section and the evaporative cooling section in an adiabatic mode if a first set of control conditions is met and in a hybrid mode if a second set of control conditions is met.

According to one embodiment, a cooling system includes a dehumidification system that is upstream from two or more air channeling sub-systems. The dehumidification system may provide dehumidified air all of the air channeling sub-systems in the cooling system.

According to one embodiment, a method for cooling a data center includes providing a dehumidification system and one or more air channeling sub-systems. At least one of the air channeling sub-systems includes a mechanical cooling section and a evaporative cooling section downstream from the mechanical cooling section. The dehumidification system is operated to dehumidify the air being channeled through the air handling sub-systems. In certain embodiments, if one set of control conditions is met, at least one of the air channeling sub-systems is operated in an adiabatic mode in which cooling is channeled through the evaporative cooling section to evaporate water into the cooling air. If another set of control conditions is met, at least one of the air channeling sub-systems is operated in a hybrid mode in which cooling air is channeled through the mechanical cooling section to remove heat from the cooling air and channeled through the evaporative cooling section to evaporate water into the cooling air.

According to one embodiment, a method for cooling computer systems in a room of a data center includes providing an air channeling sub-system. The air channeling sub-system includes a mechanical cooling section and a direct evaporative cooling section. Cooling air is channeled through the air channeling sub-system and into the room. If a first set of control conditions is met, the air channeling sub-system is operated in an adiabatic mode. The adiabatic mode includes channeling cooling air through the direct evaporative cooling section to evaporate water into the cooling air. If a second set of control conditions is met, the air channeling sub-system is operated in a hybrid mode. The hybrid mode includes channeling cooling air through the mechanical cooling section to remove heat from the cooling air and channeling the cooling air through the direct evaporative cooling section to evaporate water into the cooling air. In one embodiment, the first set of control conditions is met, and the system is operated in adiabatic mode, if the measured ambient air temperature is at or above an ambient air temperature maximum set point and the supply air enthalpy is at or below a supply air enthalpy set point. The second set of control conditions is met, and the system is operated in hybrid mode, if the measured ambient air temperature is at or above the ambient air temperature maximum set point and the supply air enthalpy is above the supply air enthalpy set point.

In certain embodiments, the air channeling sub-system may be operated in an economizer mode if a third set of control conditions is met. Operating in the economizer mode may include channeling cooling air through the direct evaporative cooling section to evaporate water into the cooling air, and controlling a humidity of supply air to the data room by controlling an amount of water evaporated into the cooling air in the direct evaporative cooling section. In one embodiment, the third set of control conditions is met, and the system is operated in economizer mode, if the measured ambient air temperature is below an ambient temperature minimum set point and the supply air enthalpy is below a supply air enthalpy set point.

In certain embodiments, the air channeling sub-system may be operated in a free cooling mode if a fourth set of control conditions is met. Operating in the free cooling mode may include channeling air from the outside through the room while the mechanical cooling section and the direct evaporative cooling section are shut down or inhibited from operation, and exhausting air from the room to the outdoors. In one embodiment, the fourth set of control conditions is met if the ambient air temperature is within a desired temperature control band.

In certain embodiments, the air channeling sub-system may be operated in a mechanical mode if a fifth set of control conditions is met. Operating in the mechanical mode may include channeling cooling air through the mechanical cooling section to remove heat from the cooling air. The cooling air may be recirculated from the room through the air channeling sub-system. In one embodiment, the fifth set of control conditions is met if the measured ambient temperature is above an ambient temperature maximum set point, the ambient relative humidity is above an ambient relative humidity set point, and the supply air enthalpy is above an enthalpy set point. In another embodiment, the fifth set of control conditions is met if the outside air is unusable.

According to one embodiment, a system for cooling computer systems in a room of a data center includes and an air channeling sub-system that provides cooling air to electronic equipment in the data center. The air channeling sub-system includes a evaporative cooling section that evaporates water into the cooling air. The air channeling sub-system includes a bypass duct to channel the cooling air to bypass the direct evaporative cooling section, and one or more dampers configurable to direct at least a portion of the cooling air through the bypass duct instead of the direct evaporative cooling section.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, "evaporative cooling" means cooling of air by evaporation of liquid.

As used herein, "direct evaporative cooling" means cooling of air by evaporation of liquid directly into a stream of air to be cooled.

As used herein, "adiabatic system" means a system that cools by evaporation of a liquid.

As used herein, "ambient" refers to a condition of outside air at the location of a system or data center. An ambient temperature may be taken, for example, at or near an intake hood of an air handling system.

As used herein, a "free cooling mode" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

In various embodiments, a cooling system for a data center may include a multi-stage cooling arrangement. In one embodiment, the multi-stage arrangement may include a mechanical cooling system and a direct evaporative cooling system downstream from the mechanical cooling system. A cooling system that includes both a mechanical cooling system and a direct evaporative cooling system may allow a design in which each system has a smaller capacity than a system having only a mechanical cooling system or only an evaporative cooling system.

In some embodiments, a cooling system includes a dehumidification system. In certain embodiments, the dehumidification system is located upstream from other apparatus in the cooling system, such as an evaporative cooling system. A dehumidification system may provide air to a data room and/or cooling apparatus in an air handling sub-system that is relatively dry as compared, for example, to outside air.

FIG. 1 is a schematic view of an embodiment of a data center cooling system including a dehumidification system, a mechanical cooling section and a direct evaporative cooling section. Cooling system 100 may remove heat from computer systems operating in data center 102. In the embodiment illustrated in FIG. 1, cooling system 100 includes air handling sub-system 104. Air handling sub-system 104 may channel cooling air to data center 102.

The number of air handling sub-systems 104 in cooling system 100 may vary. In some embodiments, cooling system 100 includes many air handling sub-systems 104. In one embodiment, cooling system 100 may include four air handling sub-systems 104. In another embodiment, cooling system 100 includes only one air handling sub-system 104. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center are provided with outside air vents. For example, half the air handling systems at a data center may have both outside air vents and return air vents, while the other half the air handling systems at a data center have only return air vents.

Each air handling sub-system 104 may be coupled to data center 102 by supply duct 108 and return duct 110. Cooling air may flow from air handling sub-system 104 through supply duct 108 into plenum 112. From plenum 112, cooling air may pass through flow restriction devices 114 into room 116. Cooling air may pass over racks 118. After the air is heated by racks 118, the air may pass through return duct 110. Air may be recirculated through one or more air handling sub-systems or discharged from the system through exhaust vent 120. Exhaust vent 120 includes exhaust damper 122.

Air for cooling system 100 may be drawn from outside air, recirculated air, or a combination of outside air and recirculated air. Air handling sub-system 104 includes outside air vent 124. Outside air vent 124 includes outside air damper 126. Air handling sub-system 104 includes mixing air damper 130.

Cooling system 100 includes dehumidification system 131, filter bank 132, chilled water sub-system 134, evaporative cooler 136, and supply fan 138, and return fan 144. In one embodiment, filter bank 132 includes a series of four filters. Cooling system 100 includes bypass duct 140. Bypass duct 140 may allow for all or a portion of the supply air to bypass evaporative cooler 136. Evaporative cooler bypass damper 141 and evaporative cooler face damper 142 may be selectively positioned to control flow through evaporative cooler 136. Cooling system 100 includes return air bypass 151 and return air bypass damper 152.

Supply fan 138 and return fan 144 are coupled to VFDs 146. VFD 146 is coupled to control unit 150.

Chilled water subsystem 134 is coupled in heat transfer communication with air handling sub-systems 104. Chilled water sub-system 134 includes coils 154 and valve 156. Valve 156 is coupled to control unit 150. Valve 156 may be opened and closed by signals from control unit 150. The position of valve 156 may be used to regulate the use of chilled water to cool air in air handling sub-system 104. In one embodiment, a common chilled water subsystem 134 provides chilled water to two more air handling sub-systems. In certain embodiments, each air handling sub-system is cooled by a dedicated chilled water subsystem 134.

Chilled water sub-system 134 includes at least one pump 160 coupled in flow communication with a flow control valve 156. Valve 156 is coupled in flow communication with coils 154 such that chilled water flow through coils 154 is facilitated while air flows across coils 154. Coils 154 are coupled in flow communication with at least one chilled water heat exchanger 162 via a plurality of tubes that are coupled in flow communication with pump 160.

Cooling system 100 further includes a chilled water heat removal sub-system 168. Heat removal sub-system 168 may be any sub-system that facilitates operation of system 100. In one embodiment, heat removal sub-system 168 is an air-conditioning refrigerant sub-system. In another embodiment, heat removal sub-system 168 is a cooling tower sub-system. In still another embodiment, heat removal sub-system 168 is a service water sub-system. In certain embodiments, a mechanical cooling system such as an air-conditioning refrigerant system may be in direct heat transfer communication with cooling air in air handling sub-systems 104. For example, evaporator coils of an air conditioning system may be positioned downstream from filter bank 132.

Dehumidification system 131 includes pump 600 coupled in flow communication with a flow control valve 602. Valve 602 is coupled in flow communication with coils 604 such that water or another fluid flows through coils 604 while air flows across coils 604. Coils 604 are coupled in flow communication with pump 160. Coils 604 may carry a fluid whose temperature is lower than the dew point of the air to be dehumidified. In some embodiments, the fluid in coils 604 is tap water. The tap water may be at a temperature of about 55 to 60 degrees F., for example. In certain embodiments, the fluid in coils 604 is water that has or will be used in cooling or evaporation towers for the data center. In certain embodiments, a dehumidification system is provided as a sideline/offset chiller (for example, in a separate channel from the main channel of an air channeling system).

Dehumidification system 131 further includes drain 610 and drainpipe 612. Condensation that forms on coils 604 may collect in drain 610 and be carried away from air handling sub-system 104 in drainpipe 612.

In cooling system 100 illustrated in FIG. 1, dehumidification system 131 can be used to dehumidify air from outside air, recirculated air, or a combination of outside air and recirculated air, depending on the mode of operation of cooling system 100.

Control unit 150 may be programmed to control devices in air handling sub-systems 102, chilled water sub-systems 134, heat removal sub-systems, and or dehumidification system 131. Control unit 150 is coupled to supply fan 138, return fan 144, outside air damper 126, exhaust damper 122, and mixing air damper 130. Control unit 150 is in data communication with temperature sensors, humidity sensors, and pressures sensors. For example, control unit 150 is in data communication with temperature sensor 151 located near the intake hood of cooling system 100. In one embodiment, control unit 150 is in data communication with sensors 616 at a location downstream from dehumidification system 131. In some embodiments, control unit 150 is operated to control the flow and/or temperature of water in coils 604 of dehumidification system 131.

In one embodiment, all of the air handling sub-systems and chilled-water sub-systems at a data center are controlled with a common control unit. In other embodiments, separate controllers are provided for each air handling sub-system and chilled water sub-systems, or for a subset of the air handling sub-systems and/or chilled water sub-systems. Devices in air handling sub-systems and chilled water sub-systems may be controlled automatically, manually, or a combination thereof.

In certain embodiments, control unit 150 includes at least one programmable logic controller. The PLC may, among other things, open and close dampers in air handling system 104 based upon command signals from an operator to channel air flow through data center 102 as necessary for the prevailing operational conditions. Alternatively, the PLC may modulate dampers between fully open and fully closed positions to modulate airflow.

Cooling system 100 also includes a plurality of temperature measurement devices that, in one embodiment, are thermocouples. Alternatively, the temperature measurement devices include, but not be limited to, resistance temperature detectors (RTDs) and any device that facilitate operation of cooling system 100 as described herein. For example, a chilled water thermocouple may be positioned within chilled water subsystem 138 to facilitate measuring a temperature of the chilled water upon discharge from a heat exchanger. In the one embodiment, such chilled water temperatures are controlled to approximately 5.6 degrees Celsius (° C.) (42 degrees Fahrenheit (° F.)).

In the embodiment shown in FIG. 1, air handling sub-system 104 may force air through supply duct 108 into plenum 112. In other embodiments, cooling air may be forced directly into room 116 through a supply duct without going through a plenum. In various embodiments, flow restriction devices 114 may be chosen to control the flow rates and distribution of cooling air among various racks 118 in room 116.

In various embodiments, operation of one or more air handling sub-systems of a cooling system may be controlled in response to one or more conditions. For example, the controller may be programmed to switch the air source for an air-handling sub-system from return air to outside air when one or more predetermined conditions are met, such as temperature and humidity.

Figure 1A:
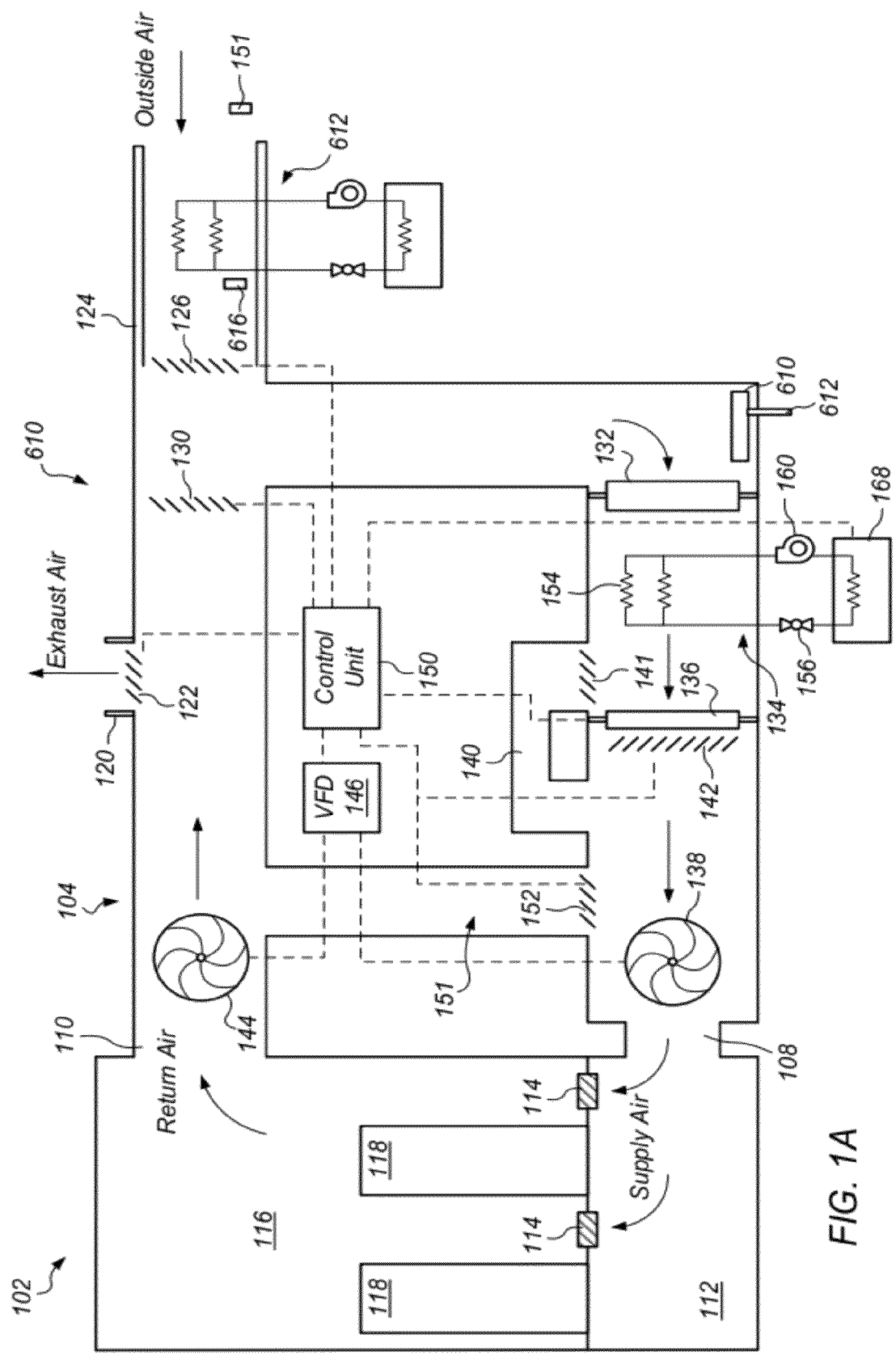
FIG. 1A is a schematic diagram illustrating an alternate embodiment of a data center cooling system including a mechanical system and an adiabatic system, and further including a dehumidification system at a location upstream from the air handling sub-system.

FIG. 1A is a schematic diagram illustrating an alternate embodiment of a data center cooling system including a mechanical system and an adiabatic system, and further including a dehumidification system at a location upstream from the air-handling sub-system. Cooling system 610 includes dehumidification system 612 at a location upstream from air handling sub-system 104. Cooling system 610 may be similar to cooling system 100 described above with respect to FIG. 1, except that dehumidification system 612 is located between the air handling subsystem and an outside air vent. Dehumidification system 612 may be similar to dehumidification system 131 described above with respect to FIG. 1. In certain embodiments, a dehumidification system, such as dehumidification system 612, may dehumidify air for more than one air handling sub-system, more than one mechanical cooling section, more than one evaporative cooling system, and/or more than one computer room. In one embodiment, dehumidification system 612 dehumidifies air for all the air-handling subsystems and all computer rooms in a data center.

Figure 1B:
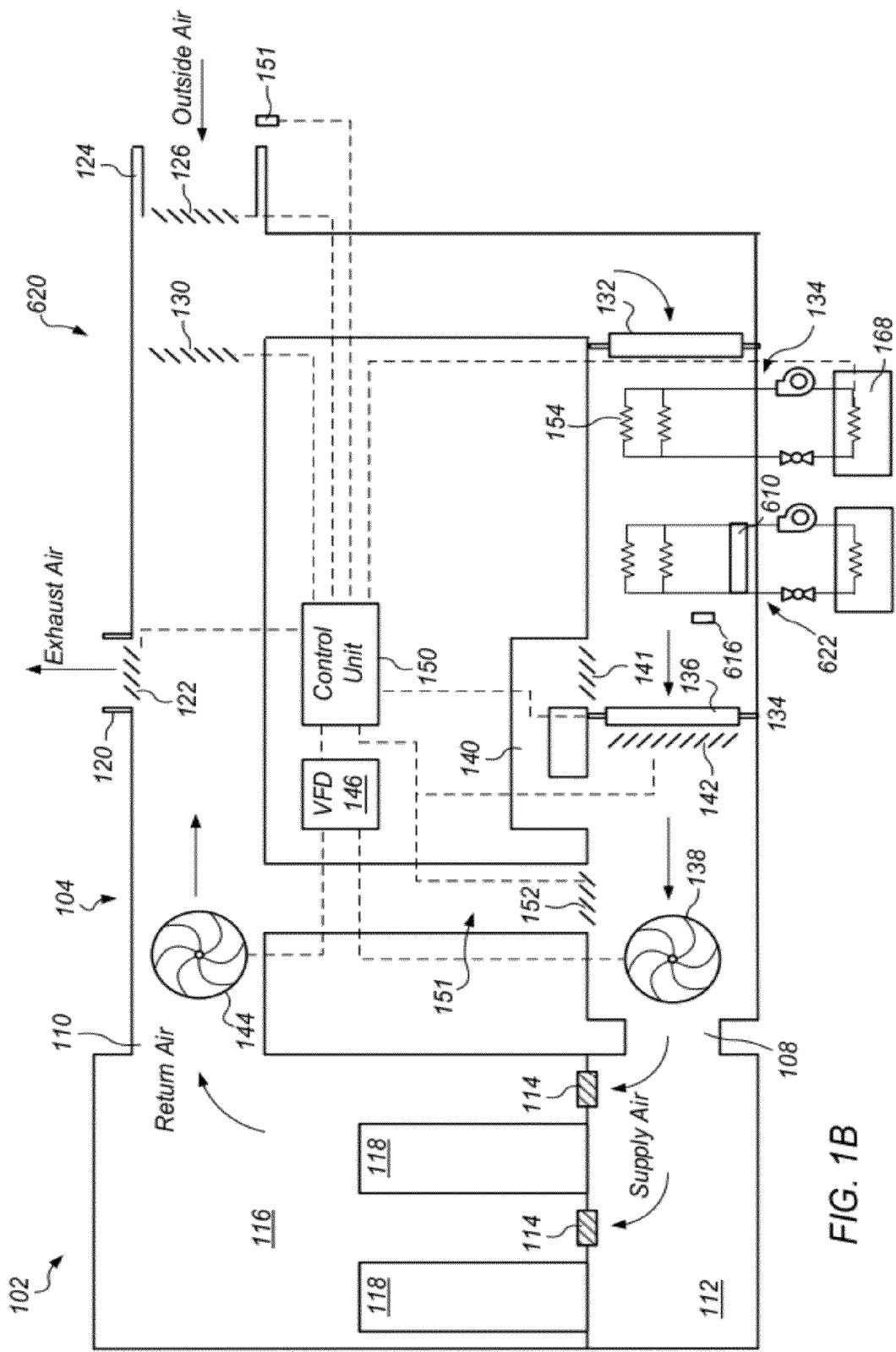
FIG. 1B is a schematic diagram illustrating an alternate embodiment of a data center cooling system including a mechanical system and an adiabatic system, and further including a dehumidification system downstream from the mechanical system.

FIG. 1B is a schematic diagram illustrating an alternate embodiment of a data center cooling system including a mechanical system and an adiabatic system, and further including a dehumidification system downstream from the mechanical system. Cooling system 620 includes dehumidification system 622. Cooling system 620 may be similar to cooling system 100 described above with respect to FIG. 1, except that dehumidification system 622 is located between the mechanical cooling section and the evaporative cooling section. Dehumidification system 622 may be similar to dehumidification system 131 described above with respect to FIG. 1. Dehumidification system 622 may remove water from air before the air reaches evaporative cooler 136.

In various embodiments, a cooling system for a data center may be operated in two or more different modes. The mode of operation at any given time may be selected based on characteristics of the outside air, characteristics of air in various locations in the cooling system, and other characteristics prevailing at or near the data center. In various embodiments, the multi-mode cooling system may minimize the amount of energy required to cool a data center. The multi-mode system may allow for a more efficient use of components of a cooling air system, allow for a reduction is size/capacity of one or more elements of the system, reduce operating costs of a cooling system, and/or improve cooling effectiveness (such as through lower operating temperatures of computer systems in the data center).

In some embodiments, a multi-mode cooling system includes an adiabatic system and a mechanical cooling section. The adiabatic system may be, for example, a direct evaporative cooler that includes a wetted media. The mechanical cooling system may be, for example, an air-conditioning refrigerant system. The adiabatic system and mechanical system may be selectively employed and adjusted based on established control conditions. The mechanical cooling system may cool the supply air directly, indirectly (e.g., by chilling water that has been circulated through an air handling system), or a combination thereof. In certain embodiments, a cooling system may include an evaporative cooling system (direct or indirect) upstream from a mechanical cooling system in lieu of, or in addition to, an evaporative cooling system (direct or indirect) downstream from the mechanical system.

Table 1 is an example of operating modes for a cooling system. In this example, the cooling mode at any given time is based on the conditions of outside air and the air at selected locations in the cooling system.

TABLE 1

Example of Cooling Modes for Air Handlers

Mode 1: Economizer

Control Conditions

| | | |
|---|---|---|
| Ambient Temperature: | <minimum set point | (typically 72° F.) |
| Supply Air Enthalpy: | <set point | (typically >30) |

Cooling Systems

| | |
|---|---|
| Outside Air | Damper controlled |
| Re-Circulation System | Damper controlled |
| Adiabatic System | Humidity control |
| Mechanical System | Off |

Notes
In this example, in the Economizer Mode, the system mixes cooler ambient air and blends it with heated return air from the data room to achieve the desired supply air set point temperature. If the return air relative humidity is below the minimum, the adiabatic system will adjust the humidity up. There is no Mechanical cooling. The conditions for this mode are that the ambient temperature is less than the low end of the desired set-point (typically 72° F.). Tight control of relative humidity may not be required on the high end because a constant heat source (servers) is provided that inhibits condensation.

Mode 2: Free-Cooling Mode

Control Conditions

| | | |
|---|---|---|
| Ambient Temperature: | Set point ± control band | (typically 76 ± 4° F.) |
| Ambient Air Relative Humidity: | >minimum set point | (typically >20%) |
| Return Air Relative Humidity: | >minimum set point | (typically >20%) |
| Supply Air Enthalpy: | <set point | (typically >30) |

Cooling Systems

| | |
|---|---|
| Outside Air | Open |
| Re-Circulation System | Closed |
| Adiabatic System | Off |
| Mechanical System | Off |

Notes
In this example, in Free-Cooling Mode the system utilizes 100% outside air to cool the data center. All the return air is exhausted to atmosphere. No Mechanical or Evaporative cooling is required. The conditions for this mode are that the ambient temperature is within the set point control band. (typically 76 ± 4° F.). Tight control of maintaining a high humidity level may not be required because a large portion of the return air can be exhausted so no water build-up occurs, and because a constant heat source (servers) is provided that inhibit condensation.

Mode 3: Adiabatic Mode

Control Conditions

| | | |
|---|---|---|
| Ambient Temperature: | >maximum set point | (typically >80° F.) |
| Supply Air Enthalpy: | <set point | (typically >30) |

Cooling Systems

| | |
|---|---|
| Outside Air | Damper controlled |
| Re-Circulation System | Damper controlled |
| Adiabatic System | On - controlled |
| Mechanical System | Off |

Notes
In this example, Adiabatic Mode is similar to Free-Cooling Mode as the system mainly utilizes outside air, however it differs in that the evaporative cooling system comes on line as a cooling source. No Mechanical cooling is required. Humidity control may be carried out in this mode. If the return air relative humidity falls below the minimum set point (typically 20%), a portion of the heated (damp) return air may be blended back to the supply air to bring the relative humidity up to within set control limits. As with the Free

TABLE 1-continued

Example of Cooling Modes for Air Handlers

Cooling Mode, tight control of maintaining a high humidity level may not be required, however, because a large portion of the return air can be exhausted so no water build-up occurs, and because a constant heat source (servers) is provided that inhibits condensation.

Mode 4: Hybrid Mode

Control Conditions

| | | |
|---|---|---|
| Ambient Temperature: | >maximum set point | (typically >80° F.) |
| Supply Air Enthalpy: | >set point | (typically >30) |

Cooling Systems

| | |
|---|---|
| Outside Air | Damper controlled |
| Re-Circulation System | Damper controlled |
| Adiabatic System | On |
| Mechanical System | On |

Notes

In this example, Hybrid Mode is similar to Adiabatic Mode as the system mainly utilizes only outside air and the adiabatic system; however, the mechanical systems also come on line. Mechanical systems cool the blended supply air temperature to within the parameters of Mode 3 - Adiabatic Mode. The adiabatic system cools the supply air to within the temperature set points. If the return air relative humidity falls below the minimum set point (typically 20%), a portion of the heated (damp) return air is blended back to the supply air to bring the relative humidity up to within set control limits. As with the Fee Cooling Mode, tight control of maintaining a high humidity level may not be required because a large portion of the return air can be exhausted so no water build-up occurs, and because a constant heat source (servers) is provided that inhibits condensation.

Mode 5: Mechanical Mode

Control Conditions

| | | |
|---|---|---|
| Ambient Temperature: | >maximum set point | (typically >80° F.) |
| Ambient Relative Humidity: | >maximum set point | (typically >80%) |
| Enthalpy: | >set point | (typically >30) |
| OR | | |
| Outside air is unusable. | | |

Cooling Systems

| | |
|---|---|
| Outside Air | Closed |
| Re-Circulation System | Open |
| Adiabatic System | Off |
| Mechanical System | On |

Notes

In this example, Mechanical Mode may include recirculation of all air such that no outside air is used. The air may be cooled to within the temperature set point by passing it across mechanically cooled coils. When this mode is relied upon, the mechanical cooling plant is preferably sized to cool the entire heat load. Humidity is monitored and controlled. The system may be operated in this mode when the wet bulb temperature is above the desired temperature control set point or if outside air is unusable. As used herein, "unusable" refers to air that contains an unacceptable of contaminants, such as airborne matter from agricultural or industrial processes.

Although the example Table 1 describes five different modes, it will be understood that in various embodiments, a cooling system may operate in only some of the modes described in Table 1. For example, a cooling system may operate in only an adiabatic mode and a hybrid mode. In addition, a cooling system may in various embodiments operate in modes in addition to those described above. The control conditions, sources of air, measured values, and various operating parameters in the various modes in the example in Table 1 for illustrative purposes only, and in various embodiments may include different control conditions, set points, and operating parameters.

Figure 1C:
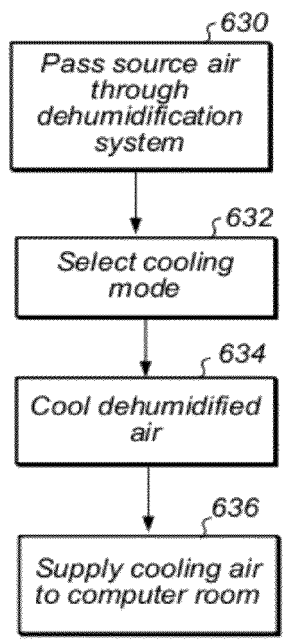
FIG. 1C is a flow diagram illustrating one embodiment of cooling a computer room of a data center with pre-dehumidification.

In some embodiments, cooling of a data center includes pre-dehumidification of source air (such as outside air). FIG. 1C is a flow diagram illustrating one embodiment of cooling a computer room of a data center with pre-dehumidification. At 630, source air to a cooling air system is passed through a dehumidification system. In one embodiment, the outside air temperature and/or temperature upstream from the dehumidification system is monitored and the fluid in the dehumidification coils is maintained a few degrees cooler than the measured air temperature. The outside air may be relatively hot and humid air, such may be found in southern Florida during summer months. In one embodiment, the fluid in a dehumidification system is tap water. Air exiting the dehumidification system may be relatively hot and dry. At 632, a mode of cooling the dehumidified air is selected. In one embodiment, the mode of cooling may be evaporative cooling. In some embodiments, the mode of cooling may be a hybrid mode that includes mechanical cooling and evaporative cooling. In certain embodiments, the operating parameters of the dehumidification system are controlled to achieve desired characteristics in the supply air to the cooling apparatus. In one embodiment, water in the coils of the dehumidification system is maintained at a temperature that is a few degrees cooler than the outside air and/or incoming air into the dehumidification system. At 634, air from the dehumidification system is cooled using one or more cooling apparatus (such as an evaporative cooling system, a mechanical cooling system, or both). At 636, air from the cooling apparatus is supplied to computer systems in a data center. In certain embodiments, air from the data room may be recirculated through a dehumidification system and/or cooling apparatus.

Figure 2:
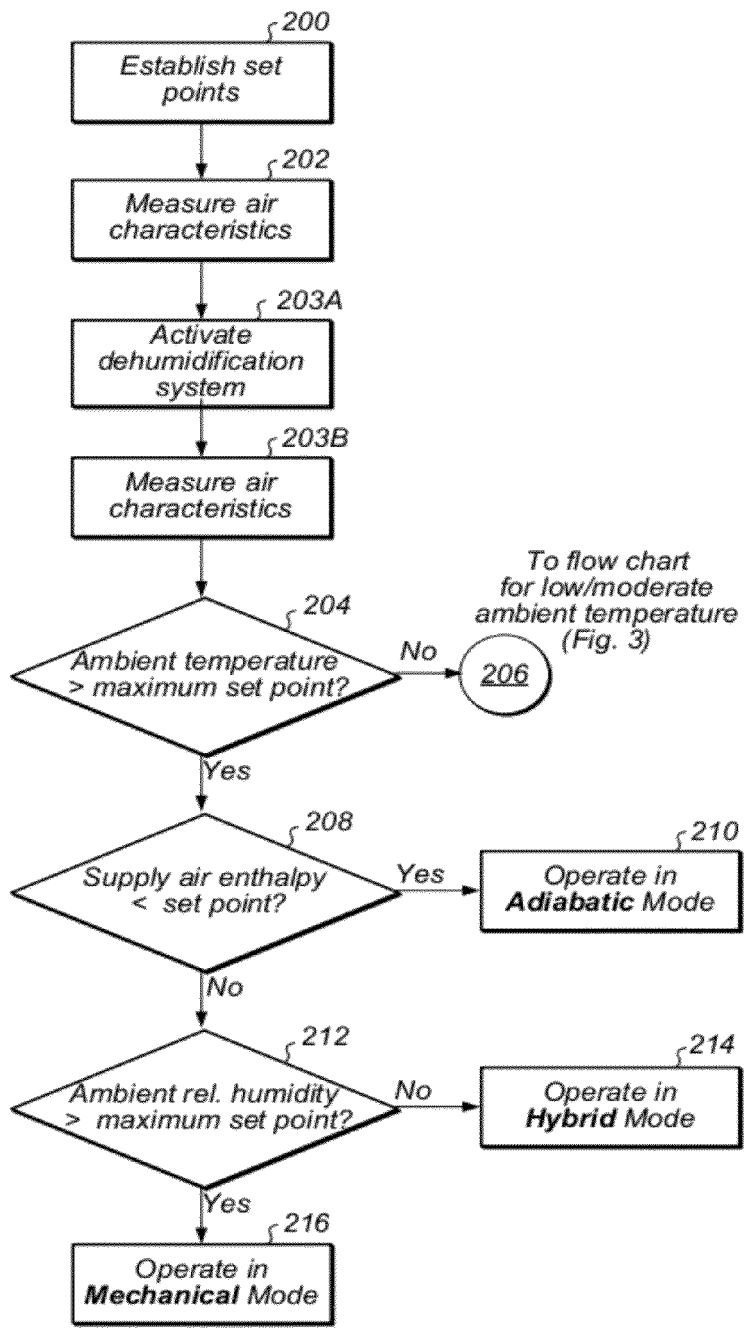
FIGS. 2 and 3 are flow diagrams illustrating one embodiment of operating a cooling system in multiple modes with pre-dehumidification.
Figure 3:
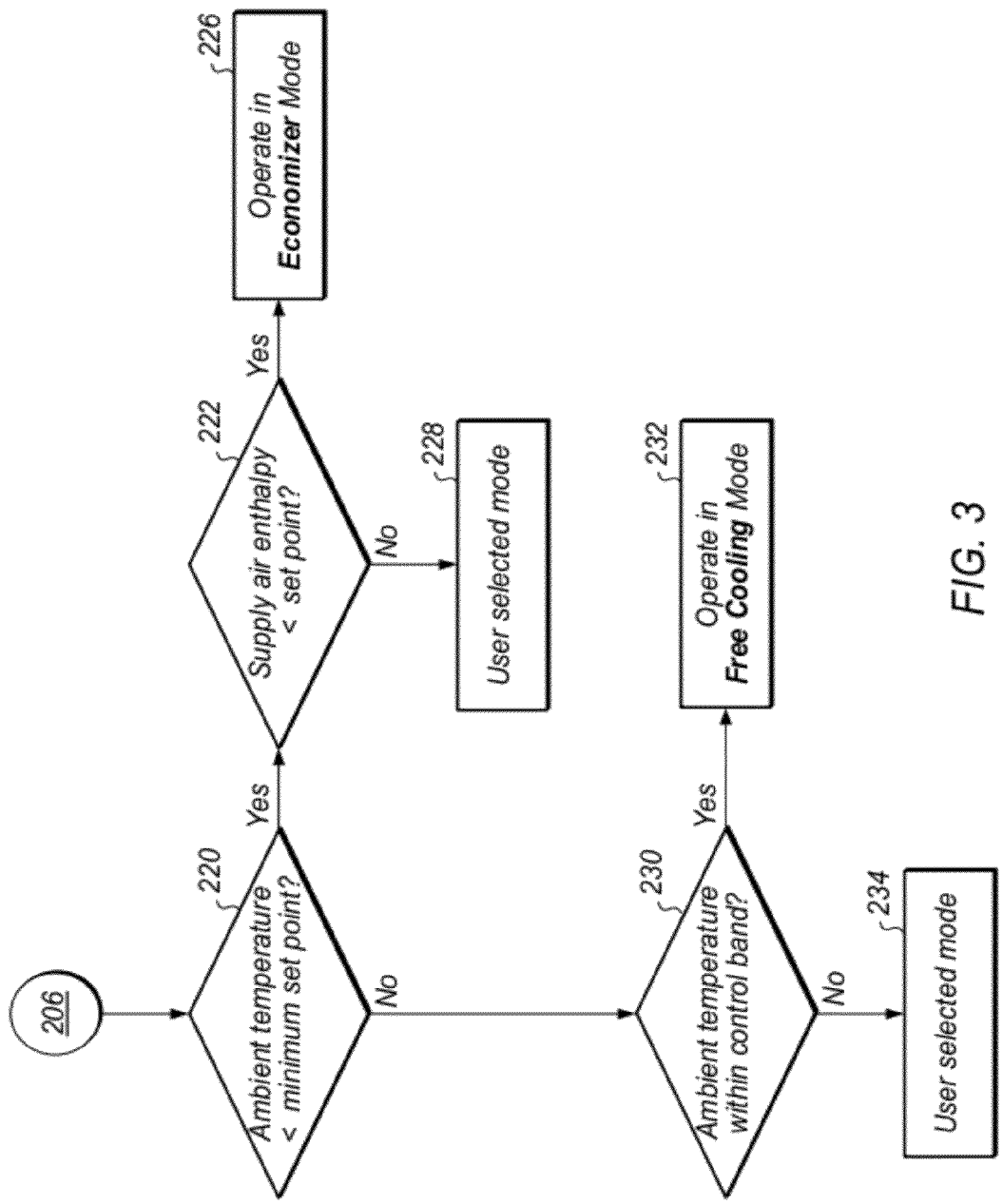

FIGS. 2 and 3 are flow diagrams illustrating one embodiment of operation of a multi-mode cooling system with pre-dehumidification. Multi-mode operation of a cooling system such as described above may be accomplished automatically, manually, or a combination thereof. In certain embodiments, switching between modes may be accomplished with an automatic controller such as described above relative to FIG. 1. At 200, set points are established for control conditions. At 202, characteristics of air are measured. Measurements such as dry bulb temperature, wet bulb temperature, humidity, and pressure may be taken for outside air, supply air, return air, or at any other location. In one embodiment, the characteristics include the humidity of the outside air. At 203A, if the measured characteristics meet specified criteria (for example, the outside air is hot and humid), the dehumidification system may be activated. In certain embodiments, a dehumidification system may be operated regardless of any measured characteristics. At 203B, air characteristics are measured with the dehumidification system in operation.

At 204, the temperature is compared to the established temperature maximum set point. In one embodiment, the measured temperature is an ambient temperature of outside air upstream from the dehumidification system. In other embodiments, the measured temperature is a temperature downstream from the dehumidification system. If the temperature is greater than the maximum set point, the supply air enthalpy may be determined and compared to an established supply air enthalpy set point. In some embodiments, the enthalpy is measured at a point upstream from the dehumidification system. In other embodiments, the enthalpy is measured at a point downstream from the dehumidification system. If the supply air enthalpy is below the set point, the system may be operated in an adiabatic mode at 210. The adiabatic mode may employ only the evaporative cooling system, without any mechanical cooling. In certain embodiments, different properties, such as wet bulb temperature, may be used as control conditions instead of, or in addition to, enthalpy.

If the measured supply air enthalpy is equal to or greater than the supply air enthalpy set point at 208, the ambient relative humidity is compared to a maximum relative humidity set point at 212. If the ambient relative humidity is equal to or less than the maximum relative humidity set point, the system may be operated in a hybrid mode at 214. In the hybrid mode, both the evaporative cooling system and the mechanical cooling system may be operated to cool the supply air to the data center.

If the ambient relative humidity is above the maximum relative humidity set point, the system may be operated in a mechanical mode at 216. In the mechanical mode, the system may employ only the mechanical cooling system, with the evaporative cooling system being disabled and/or bypassed.

Referring again to 204, if the ambient temperature is less than or equal to the ambient temperature maximum set point, conditions for low/moderate temperatures may be evaluated at 206, the details of which are illustrated on FIG. 3. At 220, the ambient temperature is compared to an ambient temperature minimum set point. If the ambient temperature set point is below the ambient temperature minimum set point, a measured supply air enthalpy may be compared to a supply air enthalpy set point at 222. If the measured supply air enthalpy is less than the set point, the system may be operated in an economizer mode. In the economizer mode, an adiabatic system may be operated to control humidity. An economizer mode may be used, for example, when the weather is cold and dry. If the supply air enthalpy is at or below the set point, a user may select the operating mode at 228.

If the ambient temperature is at or above the ambient temperature minimum set point at 220, the ambient temperature is compared to a defined temperature control band (e.g., 76±4° F.). If the ambient temperature is within the control band, the system may be operated in free cooling mode at 232. In the free cooling mode, outside air may be channeled through the air handling system and supplied to the data center while the adiabatic system and mechanical systems are off or disengaged. Air from the data center may be exhausted to the outside. If the ambient temperature is not within the control band, a user may select the operating mode at 234.

Figure 2A:
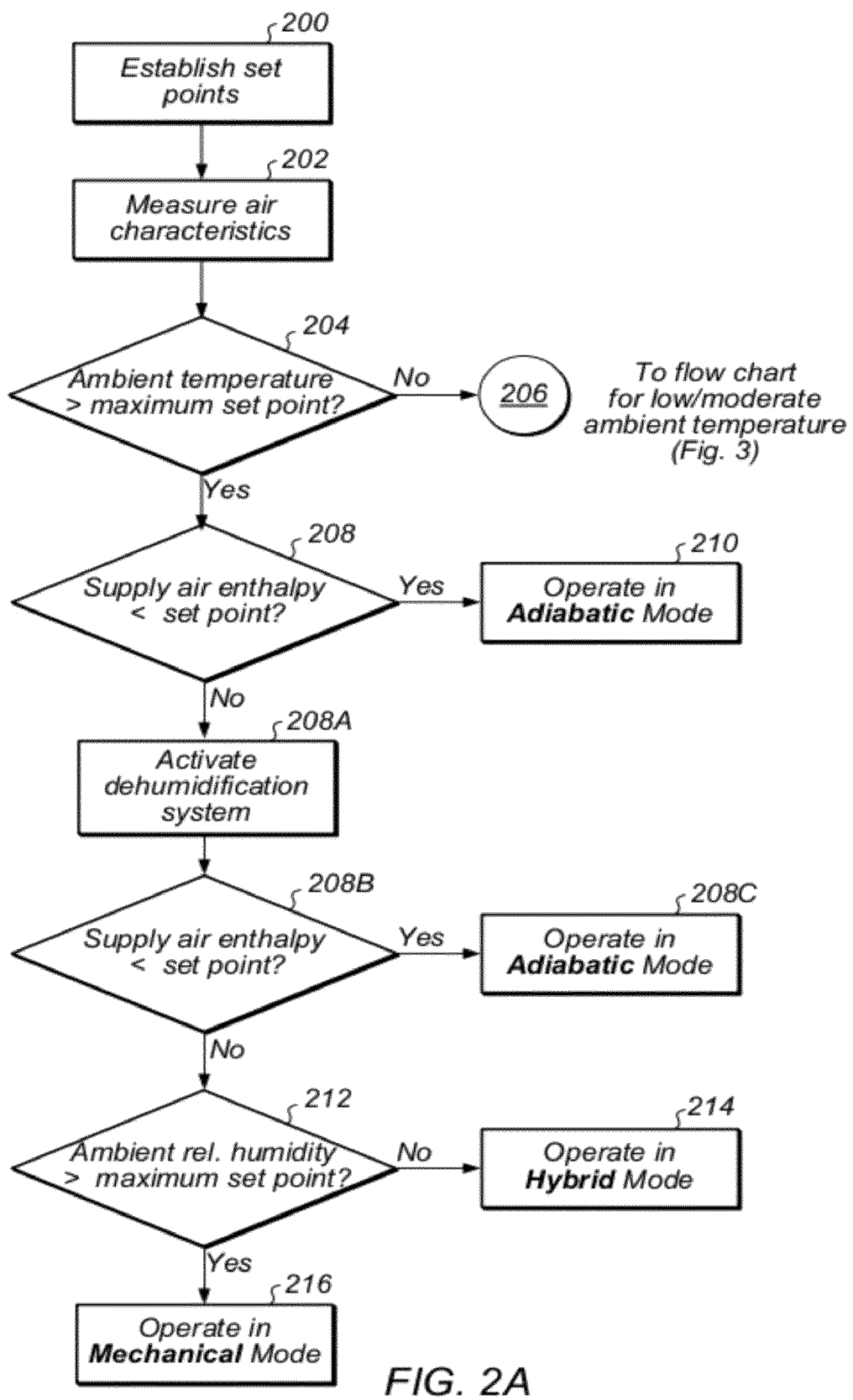
FIG. 2A is a flow diagram illustrating one embodiment of operating a cooling system in multiple modes with a pre-dehumidification mode.

FIG. 2A is a flow diagram illustrating one embodiment of operating a cooling system in multiple modes with a pre-dehumidification mode. Initially, the embodiment shown in FIG. 6A may be the same as described with respect to FIG. 6, except that the dehumidification system is not activated as indicated at 203A of FIG. 6. Beginning at 208, if the measured supply air enthalpy is equal to or greater than the supply air enthalpy set point, the dehumidification system is activated at 208A. After the dehumidification system is operating, the supply air enthalpy is re-determined at 208B. If the supply air enthalpy is below the supply air enthalpy set point, the adiabatic mode is entered at 208C. If the measured supply air enthalpy is equal to or greater than the supply air enthalpy set point, the cooling system may be operated in either a hybrid mode or mechanical mode depending on humidity conditions, as described above with respect to FIG. 2.

Figure 4:
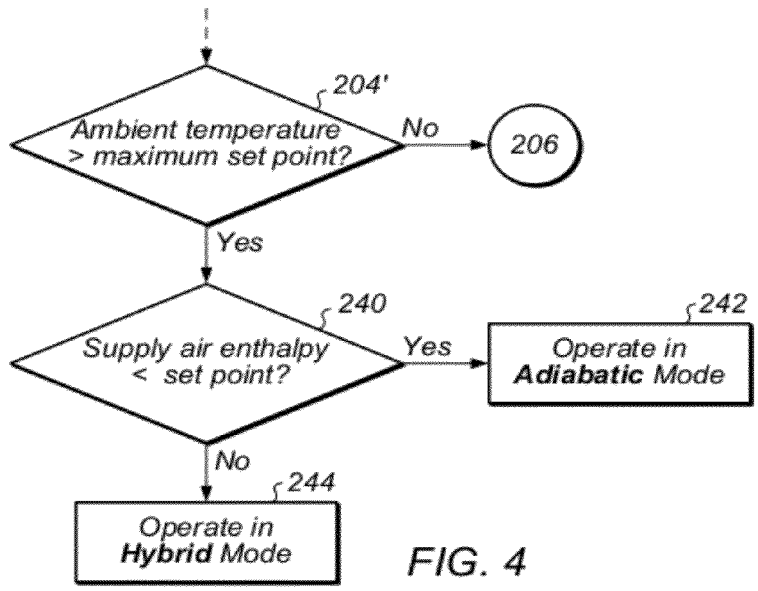
FIG. 4 illustrates is a flow diagram illustrating an alternate embodiment of determining an operating mode for ambient temperatures above a maximum ambient temperature set point.

FIG. 4 illustrates is a flow diagram illustrating an alternate embodiment of determining an operating mode where ambient temperatures are above the maximum ambient temperature set point. As in FIG. 2, set points may be established and air characteristics measured. At 204', the supply air enthalpy is compared to the set point. If the measured supply air enthalpy is below the set point, the system is operated in an adiabatic mode. If measured supply air enthalpy is at or above the set point, the system is operated in hybrid mode. Thus, in contrast to the embodiment shown in FIG. 2, the adiabatic system may remain operational (i.e., in both the adiabatic mode and the hybrid mode) regardless of the relative humidity conditions of the ambient air.

Figure 5:
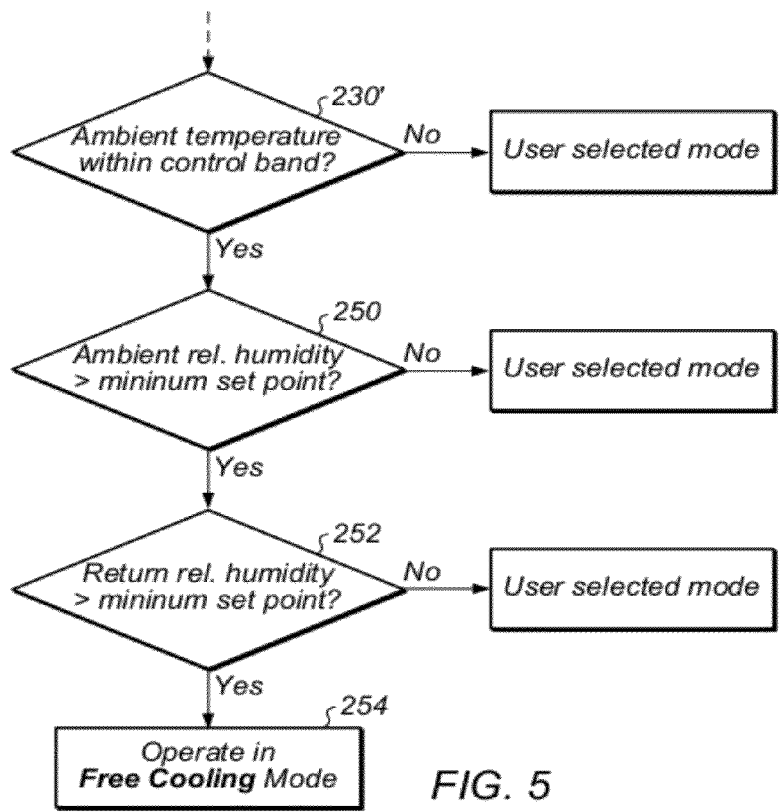
FIG. 5 illustrates is a flow diagram illustrating an alternate embodiment of determining conditions for operating in a free cooling mode.

FIG. 5 illustrates is a flow diagram illustrating an alternate embodiment of determining conditions for operating in a free cooling mode. The steps prior to 230' may be the same as shown in FIGS. 2 and 3. At 230', the ambient temperature is compared to a defined temperature control band. If the ambient temperature is within the control band, the relative humidity of the ambient air is compared to a minimum set point at 250. If the relative humidity of the ambient air is above the minimum set point, the relative humidity of the return air is compared to a minimum set point at 252. If the relative humidity of the return air is above the minimum set point at 252, then the system is operated in free cooling mode. Thus, in contrast with the embodiment shown in FIG. 3, the free cooling mode is used only after it is determined that the ambient air and the return air are above a threshold humidity level.

Figure 6:
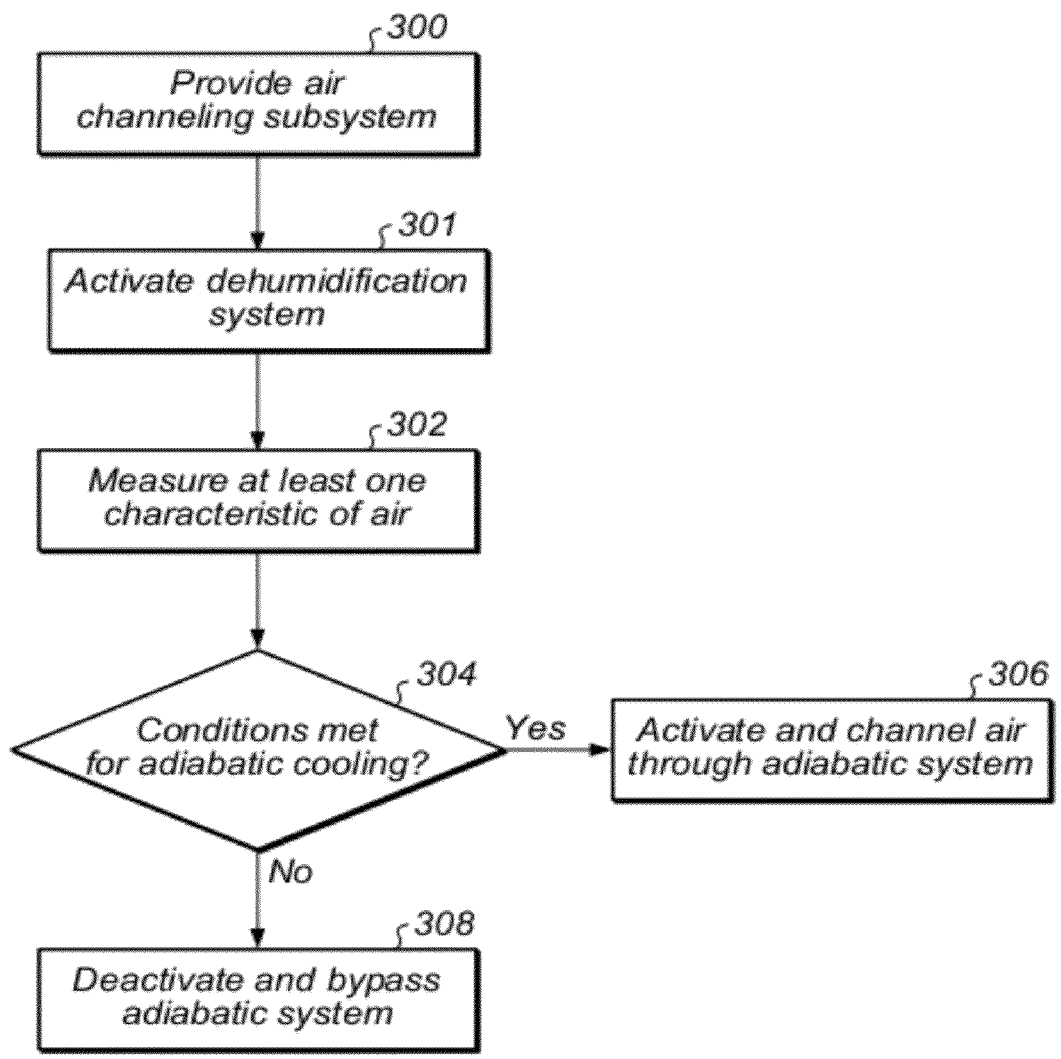
FIG. 6 is a flow diagram illustrating one embodiment of operating a cooling system having an adiabatic system bypass with pre-dehumidification.

As illustrated in FIG. 1 above, a multi-mode cooling system may in some embodiments provide for bypass of an adiabatic system. The adiabatic system may be bypassed in those modes in which adiabatic cooling is not used. FIG. 6 illustrates operation of a cooling system with pre-dehumidification and selective bypass of an adiabatic system. At 300, one or more air handling systems are provided. At 301, dehumidification system is activated. At 302, one or more control conditions are measured. At 304, control conditions are evaluated. If the control conditions are met, air is passed through the adiabatic system and the adiabatic system activated to cool the supply air at 306. As an example, air may be passed through the adiabatic system and the adiabatic system may be operated if the ambient air temperature exceeds a maximum set point and the supply air enthalpy is less than a supply air enthalpy set point (such as described above with respect to "Mode 3: Adiabatic Mode").

If the control conditions are not met or if a second set of control conditions is met, the adiabatic system may be bypassed at 308. For example, if conditions indicate that sufficient cooling can be achieved in a free cooling mode, the adiabatic system may be placed in bypass. To bypass evaporative cooler 136 in cooling system 100 shown in FIG. 1, for example, evaporative cooler bypass damper 141 may be opened and evaporative cooler face damper 142 may be closed. Subsequently, to re-enter a mode that uses the adiabatic system, the damper positions may be reversed such that evaporative cooler bypass damper 141 is closed and evaporative cooler face damper 142 is opened. In certain embodiments, the system may be operated with the evaporative cooler bypass damper 141 and/or evaporative cooler face damper 142 in partially open positions.

Figure 6A:
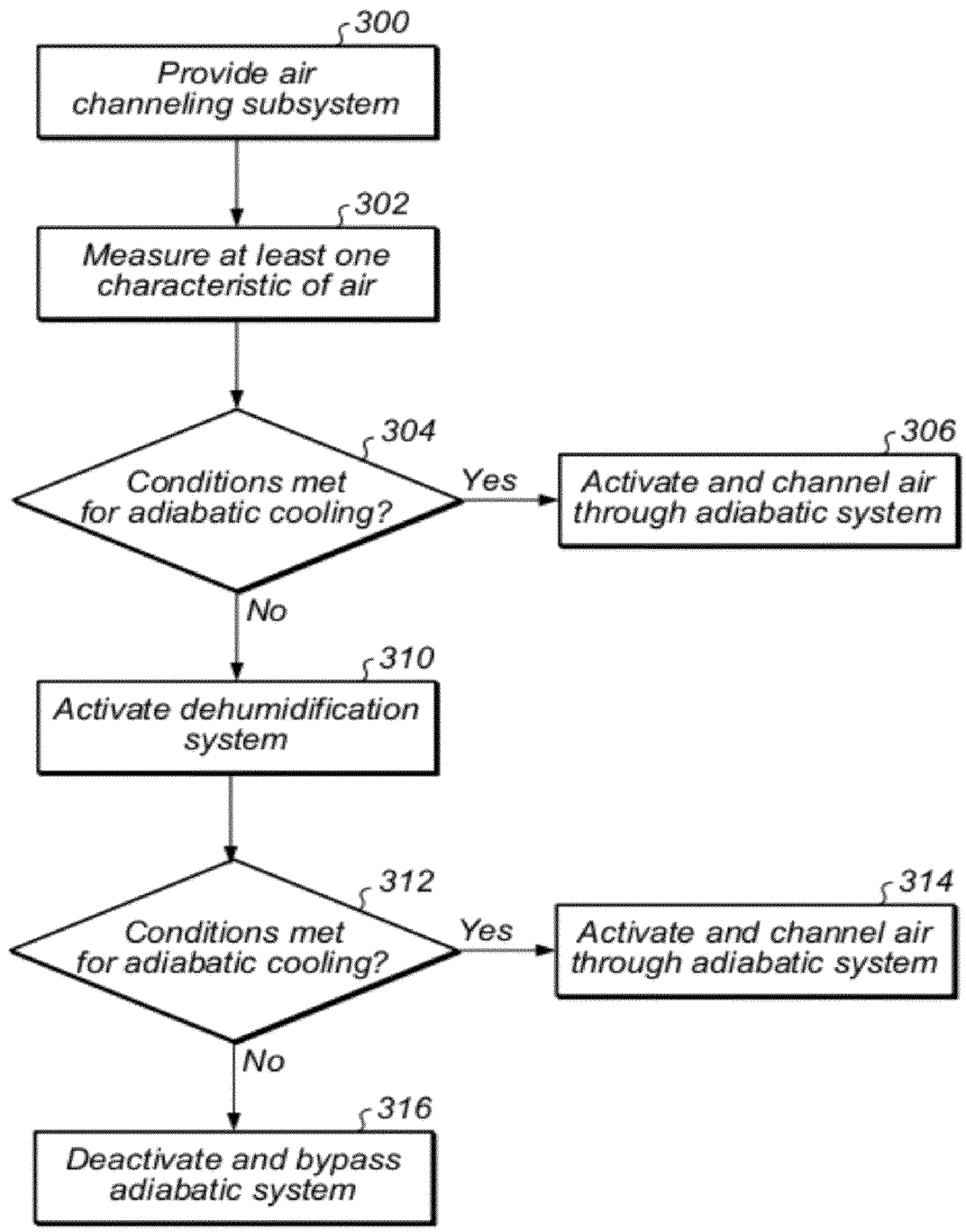
FIG. 6A is a flow diagram illustrating one embodiment of operating a cooling system having an adiabatic system bypass with a pre-dehumidification mode.

FIG. 6A is a flow diagram illustrating one embodiment of operating a cooling system having an adiabatic system bypass with a pre-dehumidification mode. Initially, the embodiment shown in FIG. 6A may be the same as described with respect to FIG. 6, except that the dehumidification system is not activated as indicated at 301 at FIG. 6. Beginning at 304, if the conditions for adiabatic cooling are not met, a dehumidification system may be activated at 310. After the dehumidification system has been operating, the conditions for adiabatic cooling may be re-evaluated at 312. If the conditions for adiabatic cooling are met, air is passed through the adiabatic system and the adiabatic system activated to cool the supply air at 314. If the control conditions are not met, the adiabatic system may be bypassed at 316.

Although in the flow charts shown in FIGS. 2-6A, control conditions are assessed in a particular sequence, it will be understood that in other embodiments the sequence may be different. In addition, the control conditions may be monitored over time (continuously or at regular or irregular intervals), and mode switching accomplished based on changes in the conditions. It will be understood that a dehumidification system may be active or inactive in the various modes of operation described herein, either continuous or based on air conditions.

Figure 7A:
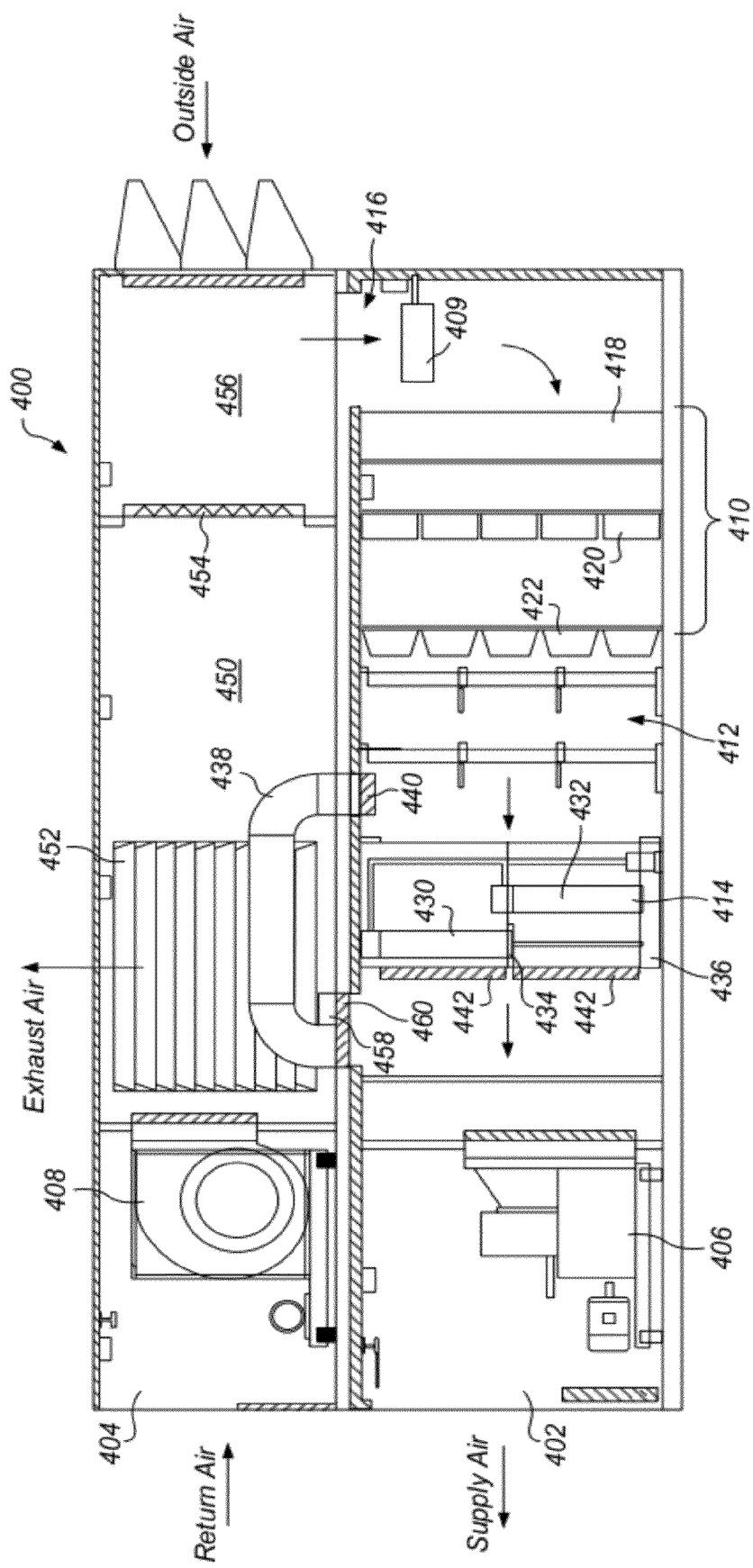
FIG. 7A is a side elevation view of one embodiment of an air handling system including a dehumidification system, a mechanical system and an adiabatic system.

FIGS. 7A-7D illustrate an embodiment of air handling unit including a dehumidification system, a mechanical cooling section and an evaporative cooling section. FIG. 7A is a side elevation view of the air handling system. FIG. 7B is a plan view of the lower level of the air handling system. FIG. 7C is a plan view of the upper level of the air handling system. FIG. 7D is a front elevation view of the air handling system.

Air handling system 400 provides supply air to a data center through supply vent 402 and receives return air from the data center through return vent 404. Air handling system 400 includes supply fans 406, return fans 408, dehumidification coils 409, filters 410, chilled water cooling coils 412, and evaporative cooling system 414. Supply fans 406 channels air from air handling system 400 into the data center through supply vent 402 on the lower level of air handling system 400. Return fans 408 channel air from the data center to air handling system 400 through return vent 404 on the upper level of air handling system 400.

In one embodiment, supply fans 406 are 180,000 cubic feet per minute, QEP-54 manufactured by Greenheck. In one embodiment, return fans 408 are 180,000 cubic feet per minute, ATLI 0-40T2 manufactured by Comefri.

Air to be supplied to the data center is forced downward from the upper level through opening 416 and then through filters 410. Air is forced successively through pre-filter 418, final filter 420, and carbon filter 422. In one embodiment, pre-filter 418 is a two-inch pleated 30% filter manufactured by Airguard. In one embodiment, final filter 420 is a 12-inch 95% filter manufactured by Airguard. In one embodiment, carbon filter 422 is a 12-inch high mass bonded carbon filter manufactured by Sparks.

After exiting filter 422, air is forced across chilled water cooling coils 412. Chilled water cooling coils 412 remove heat from the air as it passes over the coils.

Evaporative cooler 414 includes upper evaporative media bank 430, lower evaporative media bank 432, intermediate sump 434, and bottom sump 436. In one embodiment, the evaporative media is Celdek media manufactured by Munters Corporation.

Air handling system 400 includes evaporative cooler bypass duct 438, evaporative cooler bypass damper 440, and evaporative cooler face dampers 442. Depending on the mode of operation, air that has passed over cooling chilled water cooling coils 412 is either forced through evaporative media in evaporative cooler 414, through evaporative cooler bypass duct 438, or a combination thereof. In one embodiment, the evaporative cooler face velocity is about 652 feet per minute, based on a flow rate of 180,000 cubic feet per minute.

In certain embodiments, the evaporative cooling system may be operated using only one of the evaporative media banks (e.g., upper evaporative media bank 430) while the flow through the other evaporative media banks (e.g., lower evaporative media bank 432) is inhibited. Air from evaporative cooler 414 may be channeled through supply vent 402 to one or more rooms of a data center.

Return air from the data center may be received in return air chamber 450. In some embodiments, air in return air chamber 450 may be exhausted to the outside through exhaust vents 452. In other embodiments, mixing air dampers 454 may be operated to allow some or all of the return air to mix with incoming outside air in mixing region 456. In certain embodiments, air in return air chamber 450 is forced through return air bypass 458. Flow through return air bypass 458 may be controlled by return air bypass dampers 460.

Figure 8:
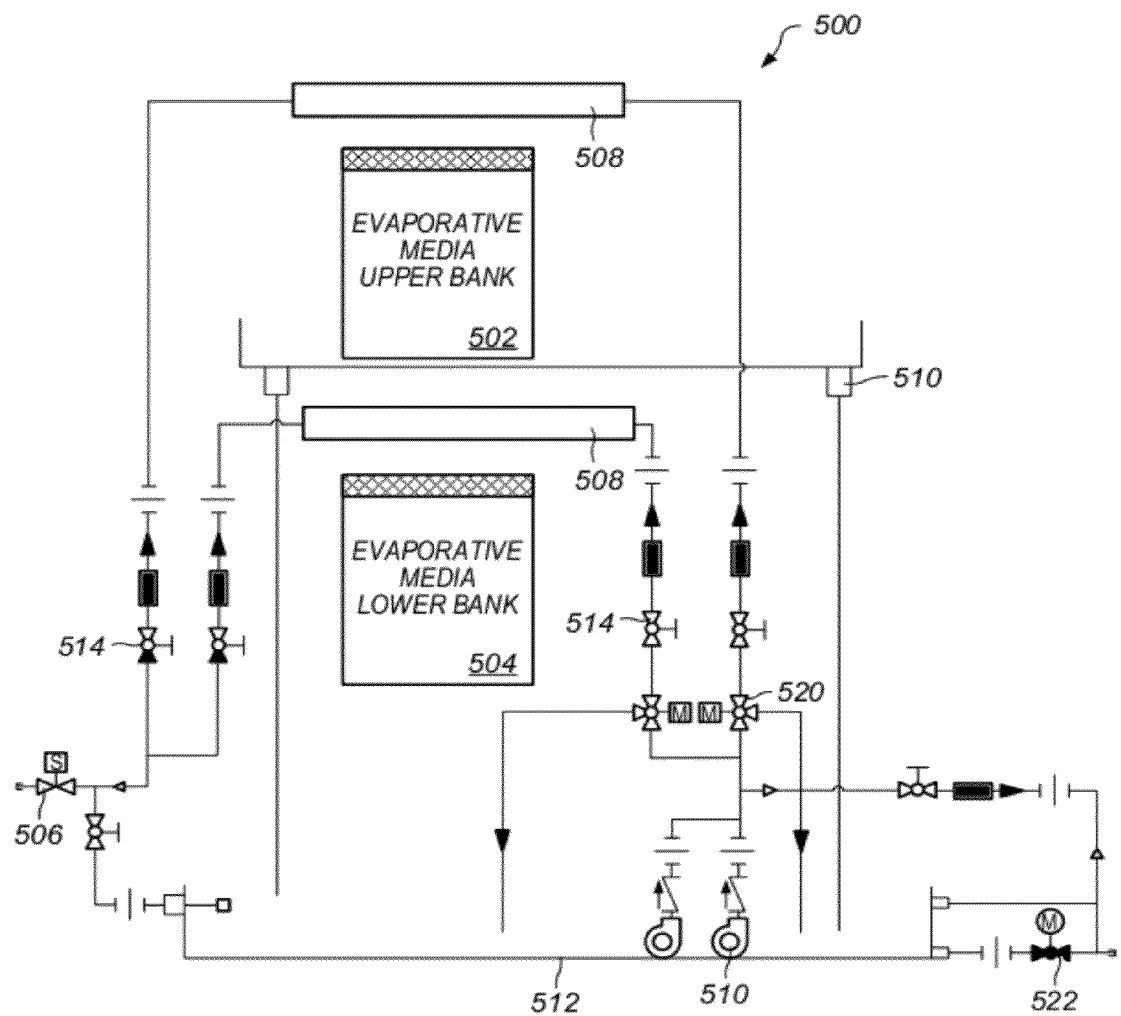
FIG. 8 is a schematic diagram of an evaporative cooling system according to one embodiment.

FIG. 8 is a fluid schematic diagram illustrating one embodiment of an evaporative cooling system including upper and lower evaporative media banks Evaporative cooling system 500 includes evaporative media upper bank 502 and evaporative media lower bank 504. Supply from a domestic water supply is provided through supply valve 506. Water is fed to each of evaporative media upper bank 502 and evaporative media lower bank 504 through distribution manifolds 508. Water may also be supplied to distribution manifolds 508 from bottom sump 512 using pumps 510. Balancing valves 514 may be controlled to balance flow to manifolds 508 and/or water levels in the media. Water may be recirculated to sump 512 using three-way valves 520. Water may be expelled or removed from the system through drain valve 522.

In certain embodiments, operation of one or more of subsystems (e.g., CRACs) may be controlled to increase or decrease the total output of the cooling system. In certain embodiments, the number of units switched from normal to free cooling mode may be selected to achieve a desired level of cooling performance. In some embodiments, switching between outside air and return air and/or shut down of the chillers may be programmed to occur in stages.

In some embodiments, air handling sub-systems may be used to remove smoke from a data center. In one embodiment, a system includes smoke detection devices in the data center. When smoke is detected by one of the devices, some or all of the air handling sub-systems are switched to outside air. Exhaust dampers may be opened to allow smoke to be purged or extracted from the data center. In one embodiment, all of air handling sub-systems that have outside air dampers are fully opened to remove smoke from the data center.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for cooling computer systems in a room of a data center, comprising:
    a dehumidification system; and
    one or more air channeling sub-systems configured to provide cooling air to electronic equipment in the data center, at least one of the one or more air channeling sub-systems comprising:
        a mechanical cooling section configured to remove heat from air;
        an evaporative cooling section, the evaporative cooling section being configured to evaporate water into the cooling air;
    wherein the dehumidification system is operative to dehumidify, prior to the evaporative cooling section, at least a portion of the air channeled through the one or more air handling sub-systems.

2. The system of claim 1, wherein the dehumidification system is upstream from the mechanical cooling section, wherein the air channeling subsystem is configured to channel dehumidified air from the dehumidification system to the mechanical cooling section.

3. The system of claim 1, wherein the dehumidification system is upstream from at least one of the air channeling sub-systems, wherein the dehumidification system is configured to dehumidify outside air, wherein the at least one air channeling subsystem is configured to channel the dehumidified air from the dehumidification system to the mechanical cooling section.

4. The system of claim 1, wherein the dehumidification system is downstream from the mechanical cooling section and upstream from the evaporative cooling section, wherein the dehumidification system is configured to dehumidify air from the mechanical cooling section, wherein the at least one air channeling subsystem is configured to channel the dehumidified air from the dehumidification system to the evaporative cooling section.

5. The system of claim 1, further comprising a controller configured to operate at least one of the air channeling sub-systems in an adiabatic mode or a hybrid mode;
    wherein operating in the adiabatic mode comprises channeling air through the evaporative cooling section to evaporate water into the air; and
    wherein operating in the hybrid mode comprises channeling air through the mechanical cooling section to remove heat from the air and channeling the air through the evaporative cooling section to evaporate water into the air.

6. The system of claim 1, further comprising a controller coupled to the mechanical cooling section and the evaporative cooling section, the controller configured to selectively operate the mechanical cooling section and the evaporative cooling section in an adiabatic mode if a first set of control conditions is met and in a hybrid mode if a second set of control conditions is met;
    wherein operating in the adiabatic mode comprises channeling air through the evaporative cooling section to evaporate water into the air; and
    wherein operating in the hybrid mode comprises channeling air through the mechanical cooling section to remove heat from the air and channeling the air through the evaporative cooling section to evaporate water into the air.

7. The system of claim 6, further comprising at least one sensor configured to measure at least one characteristic of air downstream from the dehumidification system, wherein at least one of the first set of control conditions and the second set of control conditions is based on the characteristic of air downstream from the dehumidification system.

8. The system of claim 6, further comprising at least one sensor configured to measure at least one characteristic of outside air, wherein at least one of the first set of control conditions and the second set of control conditions is based on the characteristic of outside air.

9. The system of claim 1, further comprising a controller configured to selectively operate the dehumidification system to dehumidify the at least a portion of the air channeled through the one or more air channeling sub-systems if a set of control conditions is met.

10. The system of claim 1, further comprising a bypass of the evaporative cooling section, wherein the bypass comprises at least one damper coupled to the controller to regulate the flow of air through the evaporative cooling section.

11. The system of claim 1, wherein the evaporative cooling section is a direct evaporative cooling system.

12. A method for cooling a data center, comprising:
    providing a dehumidification system;
    providing one or more air channeling sub-systems, at least one of the air channeling sub-systems comprising:
        a mechanical cooling section; and
        a evaporative cooling section downstream from the mechanical cooling section; and
    operating the dehumidification system to dehumidify at least a portion of the air channeled through the one or more air handling sub-systems;
    channeling air through at least one of the air channeling sub-systems and into a room.

13. The method of claim 12, wherein the dehumidification system is upstream from the mechanical cooling section and the evaporative cooling section.

14. The method of claim 12, wherein operating the dehumidification system comprising maintaining temperature of a fluid passing through coils of the dehumidification system in a temperature range that is lower than the dew point of incoming air to the dehumidification system.

15. The method of claim 12, wherein operating the dehumidification system comprises flowing tap water through coils of the dehumidification system that is at a temperature lower than the dew point of incoming air to the dehumidification system.

16. The method of claim 12, further comprising:
    measuring at least one characteristic of air; and selectively operating at least one of the mechanical cooling section and the evaporative cooling system based on the at least one characteristic.

17. The method of claim 16, wherein at least one characteristic of the air is measured in air that has passed through the dehumidification system.

18. The method of claim 12, further comprising:
measuring at least one characteristic of air; and
selectively operating the dehumidification system based on the at least one characteristic.

19. The method of claim 12, further comprising operating at least one of the air channeling sub-systems in an adiabatic mode, wherein operating in the adiabatic mode comprises channeling air through the evaporative cooling section to evaporate water into the air.

20. The method of claim 12, further comprising operating at least one of the air channeling sub-systems in a hybrid mode, wherein operating in the hybrid mode comprises channeling air through the mechanical cooling section to remove heat from the air and channeling the air through the evaporative cooling section to evaporate water into the air.

21. The method of claim 12, further comprising operating at least one of the air channeling sub-systems in an economizer mode, wherein operating in the economizer mode comprises:
channeling air through the evaporative cooling section to evaporate water into the air; and
controlling a humidity of supply air to the data room by controlling an amount of water evaporated into the air in the evaporative cooling section.

22. The method of claim 12, further comprising operating at least one of the air channeling sub-systems in a free cooling mode, wherein operating in the free cooling mode comprises:
shutting down or inhibiting operation of the mechanical cooling section and the evaporative cooling section;
channeling air from the outside through the room while the mechanical cooling section and the evaporative cooling section are shut down or inhibited from operation; and
exhausting air from the room to the outdoors.

23. The method of claim 12, further comprising bypassing the evaporative cooling section if a set of control conditions is met.

24. A method for cooling computer systems in a room of a data center, comprising:
providing a dehumidification system and one or more air channeling sub-systems, at least one of the air channeling sub-systems comprising a mechanical cooling section and an evaporative cooling section;
channeling air through the one or more air channeling sub-systems and into the room, wherein channeling air through the one or more air channeling sub-systems comprises:
operating at least one of the air channeling sub-systems in an adiabatic mode if a first set of control conditions is met, wherein operating in the adiabatic mode comprises channeling air through the evaporative cooling section to evaporate water into the air; and
operating at least one of the air channeling sub-systems in a hybrid mode if a second set of control conditions is met, wherein operating in the hybrid mode comprises channeling air through the mechanical cooling section to remove heat from the air and channeling the air through the evaporative cooling section to evaporate water into the air; and
operating the dehumidification system to dehumidify the at least a portion of the cooling air.

25. The method of claim 24, wherein the dehumidification system dehumidifies the cooling air before it enters the mechanical cooling section.

* * * * *